United States Patent [19]
Chiu

[11] Patent Number: 5,239,199
[45] Date of Patent: Aug. 24, 1993

[54] VERTICAL LEAD-ON-CHIP PACKAGE

[75] Inventor: Anthony M. Chiu, Richardson, Tex.

[73] Assignee: Texas Instruments Incorporated, Dallas, Tex.

[21] Appl. No.: 839,041

[22] Filed: Feb. 18, 1992

Related U.S. Application Data

[63] Continuation of Ser. No. 640,667, Jan. 14, 1991, abandoned.

[51] Int. Cl.⁵ .................... H05K 7/20; H01L 23/02
[52] U.S. Cl. .................... 257/706; 257/707; 257/722; 257/723; 257/726
[58] Field of Search .................... 357/68, 81, 74, 72; 257/706, 707, 722, 723, 726

[56] References Cited

U.S. PATENT DOCUMENTS

| | | | |
|---|---|---|---|
| 3,572,428 | 3/1971 | Monaco | 357/81 |
| 4,012,769 | 3/1977 | Edwards et al. | 357/81 |
| 4,538,171 | 8/1985 | Stevens et al. | 357/81 |
| 4,771,366 | 9/1988 | Blake et al. | 357/81 |
| 4,803,545 | 2/1989 | Birkle | 357/81 |
| 4,872,089 | 10/1989 | Ocken et al. | 357/81 |
| 5,016,138 | 5/1991 | Woodman | 361/385 |
| 5,019,943 | 5/1991 | Fassbenda et al. | 357/74 |

FOREIGN PATENT DOCUMENTS

| | | |
|---|---|---|
| 0216363 | 4/1987 | European Pat. Off. . |
| 0256623 | 2/1988 | European Pat. Off. . |
| 1616507 | 3/1968 | Fed. Rep. of Germany . |
| 2257888 | 11/1972 | Fed. Rep. of Germany . |
| 54-17674 | 2/1979 | Japan . |
| 62-130547 | 6/1987- | Japan . |
| 62-214652 | 9/1987 | Japan . |
| 1-115146 | 5/1989 | Japan . |
| 2-49457 | 2/1990 | Japan . |

OTHER PUBLICATIONS

Mulligan, "snap-on head exchanger", *IBM TDB*, vol. 10, No. 8 Jan. 1968, p. 1242.

Dombroski et al., "Thermal conduction stud", *IBM TDB*, vol. 19, No. 12 May 1977, pp. 4683–4685.

*Primary Examiner*—Eugene R. LaRoche
*Assistant Examiner*—Viet Q. Nguyen
*Attorney, Agent, or Firm*—Stanton C. Braden; Richard L. Donaldson

[57] ABSTRACT

A vertical lead-on-chip package and the method of making defines a high density array of semiconductor devices with leads extending from and across one face of the device, to the edge of the device such that a plurality of devices are vertically mounted on a circuit board. Each device has a heat sink thereon which is held in a fixture which serves as an array heat sink during testing and burn-in and during mounting and operation of the devices on the circuit board.

11 Claims, 4 Drawing Sheets

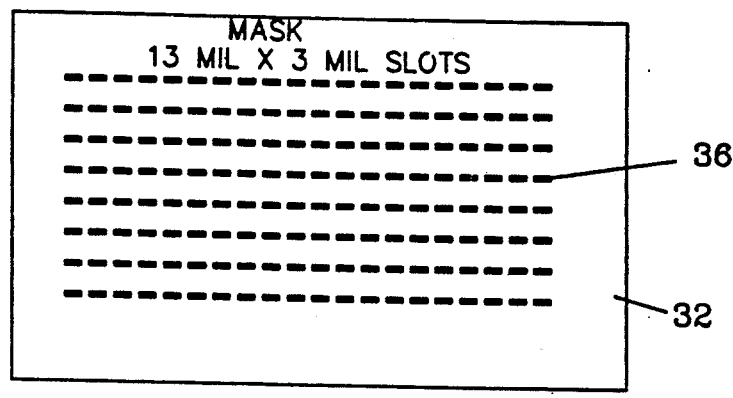
FIGURE 7
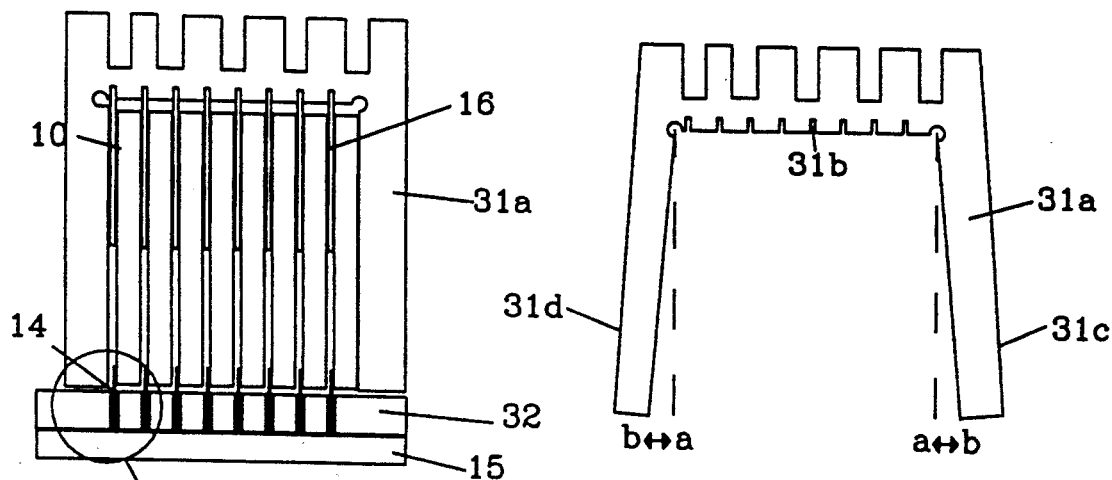
FIGURE 8
FIGURE 10
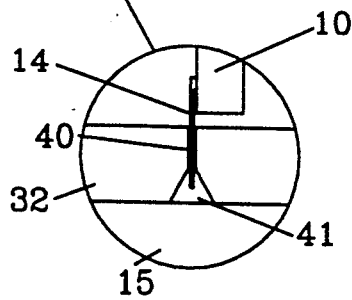
FIGURE 9

VERTICAL LEAD-ON-CHIP PACKAGE

This application is a confirmation of application Ser. No. 640,667, filed Jan. 14, 1991, abandoned.

FIELD OF THE INVENTION

This invention relates to semiconductor devices, and more particularly to a high density package for memory devices.

BACKGROUND OF THE INVENTION

High speed computing and imaging systems constantly push the state-of-the-art in data storage. Present day imaging systems and computer systems with two or more processors require data input and output rates beyond the capability of conventional packaging.

To accomplish high data rates, the physical distance between the processor and the memory array must be kept to a minimum to avoid signal delays. The throughput of a large memory array using conventional packages is determined by the longest signal line between the processor and the memory chip, assuming the memory chips can run at the same clocking rate as the processor, generally at 50 mhz and above. The following described memory array package solves problems in memory density and distance.

SUMMARY OF THE INVENTION

The invention is a high density packaging technique for memory arrays. A heat sink structure on each memory package serves as a heat sink, an assembly tool and tooling interface. An insulating material such as polyimide is placed on both sides of the chip and serves an insulation between closely mounted semiconductor devices. The package is suitable for both through-hole and surface mounting. Multiple devices are fixtured together for test and burn-in. The fixture is use to hold the devices during test and burn-in and then serves as a heat sink for the mounted array of devices. The packaging is suitable not only for memory chips, but any semiconductor driver/logic circuits by using the same package form factor.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTION OF THE DRAWINGS

FIG. 7 is a top view of a solder mask

FIG. 8 shows a mounted array of devices;

FIG. 9 is an enlarged view of the surface mount connection; and

FIG. 10 illustrates the spring action of the heat sink.

DESCRIPTION OF A PREFERRED EMBODIMENT

Figure 1:
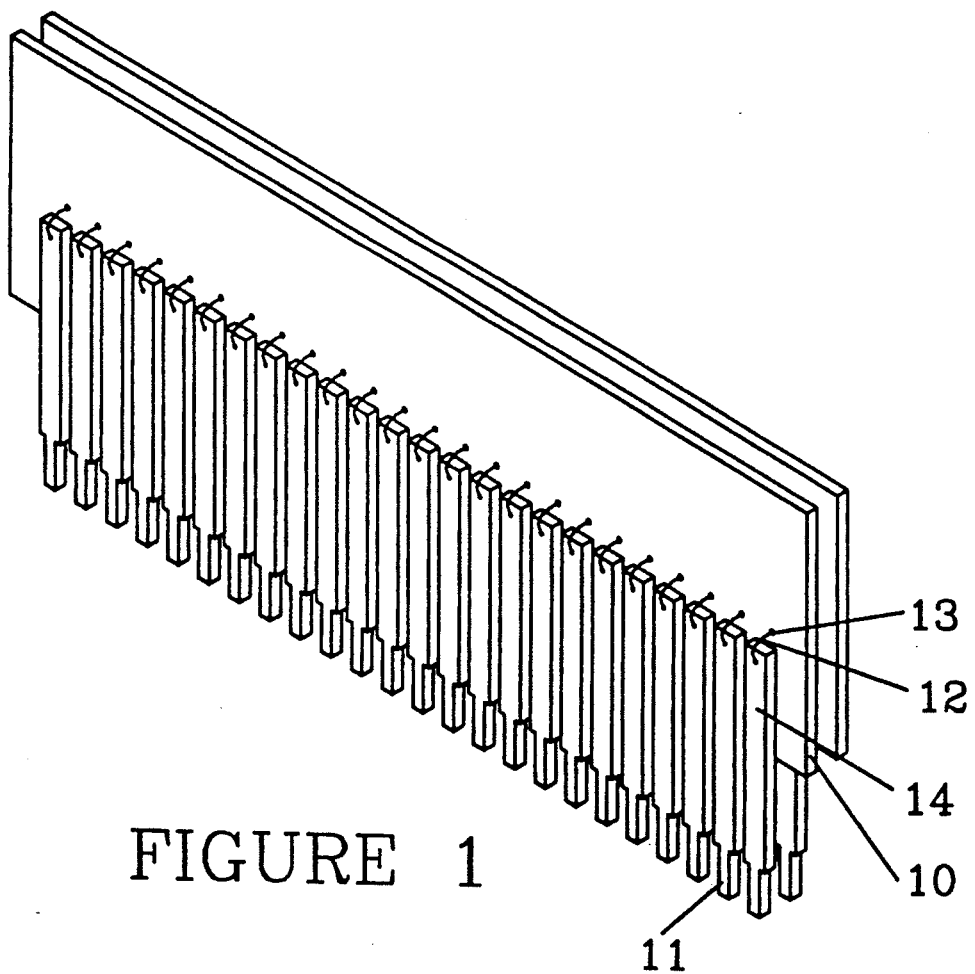
FIG. 1 is an isometric view of an array of memory devices.

FIG. 1 is representative of an array of semiconductor memory devices, illustrated without a heat sink. Each memory device 10 has a plurality of leads 14 connected to bond pads 13 on the device by connection wires 12. Each lead 14 may have a reduced size end 11.

Figures 2, 3:
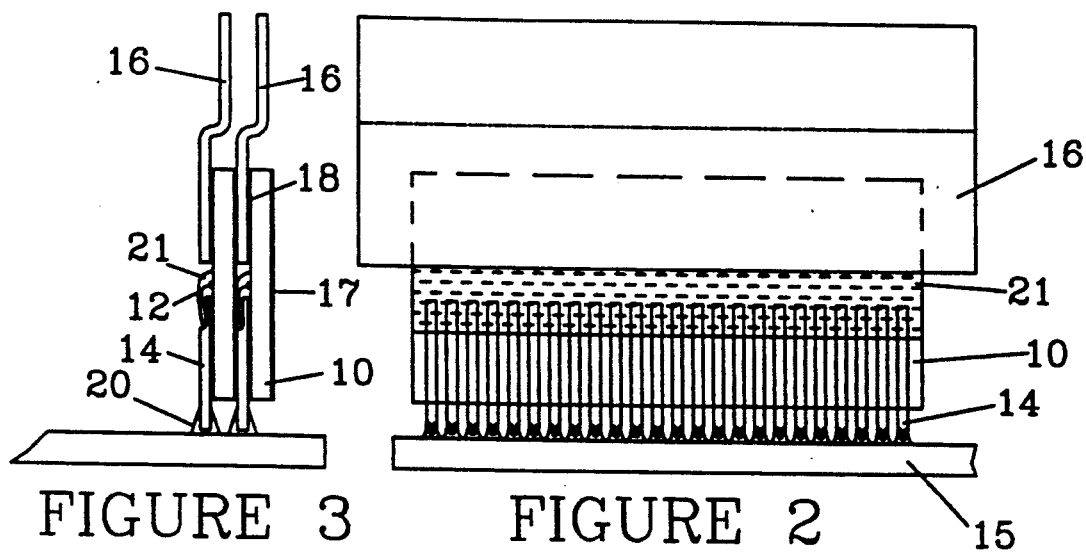
FIG. 2 is a front view of a surface mounted device.
FIG. 3 is a side view of the surface mounted device.

FIG. 2 is a front view of the package of the present invention in which the devices are surface mounted, and FIG. 3 is a side view showing two mounted devices. Device 10 has a heat sink 16 mounted on the top side, as illustrated, and the leads 14 connected on the bottom side of the device. The devices are surface mounted to a circuit board 15.

Figures 3A, 3B:
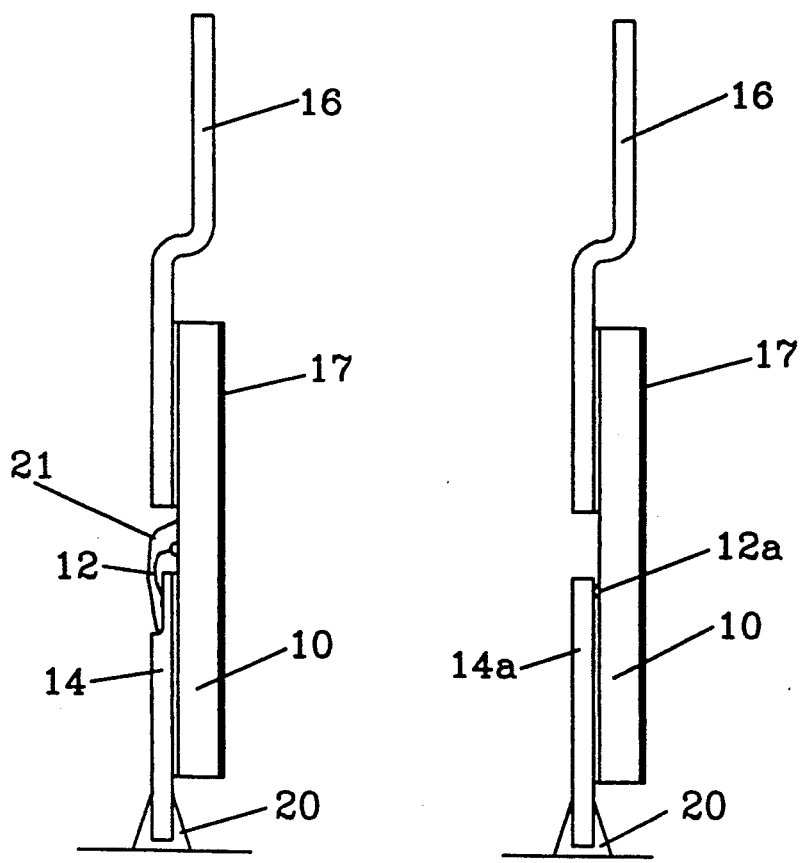
FIGS. 3a and 3b illustrate two different contacts from the vertical lead to the semiconductor device.

Side view, FIG. 3, is an enlarged view showing more detail of each device, and the surface mounting feature. Each device 10 has an insulating coating 17 on the back side and a coating 18 over the front side. The insulating material may be, for example, polyimide. Coating 17, on the backside of the device prevents the back of one device from shorting the front of the adjacent device when the two devices are in contact. Insulating layer 18, on the front of the device, insulates heat sink 16 from the device, and also provides an insulating mounting surface for leads 14. A layer of insulating material 21 is placed over the bond wire 12, its connection to the bond pad 13 on the device 10, and its connection to the lead 14. FIG. 3a is an enlarged view of the wire bond illustrated in FIG. 3.

FIG. 3b illustrates another way to bond the lead 14a to device 10. A contact bump 12a on device 10 is connected to lead 14a. This method is TAB or Tape Automated Bonding.

In surface mounting each device, leads 14 are joined to circuit board 15 by reflow solder. The solder 20 bonds leads 14 to electrical connections such as solder pads (not illustrated) on circuit board 15.

Figure 4:
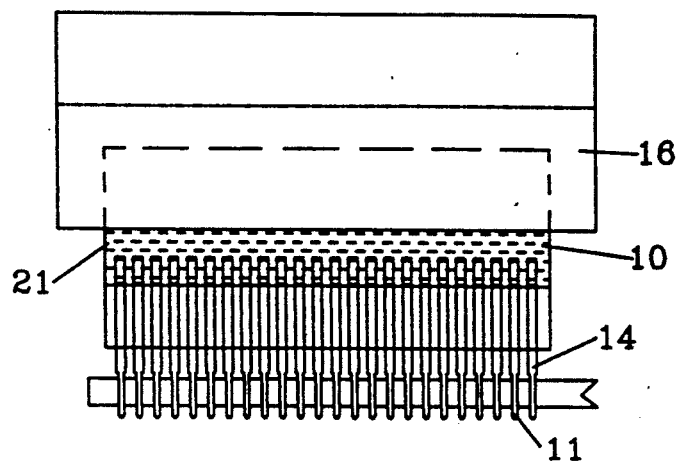
FIG. 4 is a front view of a through-hole assembly.

FIG. 4 is a front view of a device mounted in a through-hole assembly. Device 10 has leads 14 attached thereto. Leads 14 have reduced area ends 11 which extend though the circuit board 15. Openings in the metalization on the circuit board extend through the circuit board, and, in some instances, the openings may be plated through the circuit board.

Figure 5:
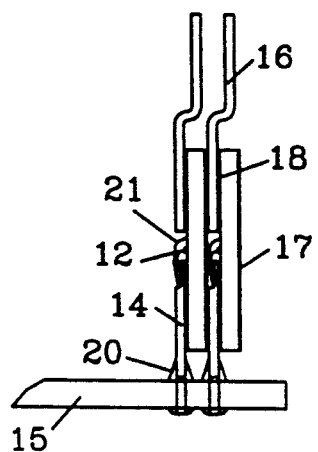
FIG. 5 is a side view of the through-hole assembly.

FIG. 5 is a side view of the assembly of FIG. 4. Solder 20 is shown formed around leads 14, reduced lead ends 11 and around the opening in the circuit board 15.

Figure 6:
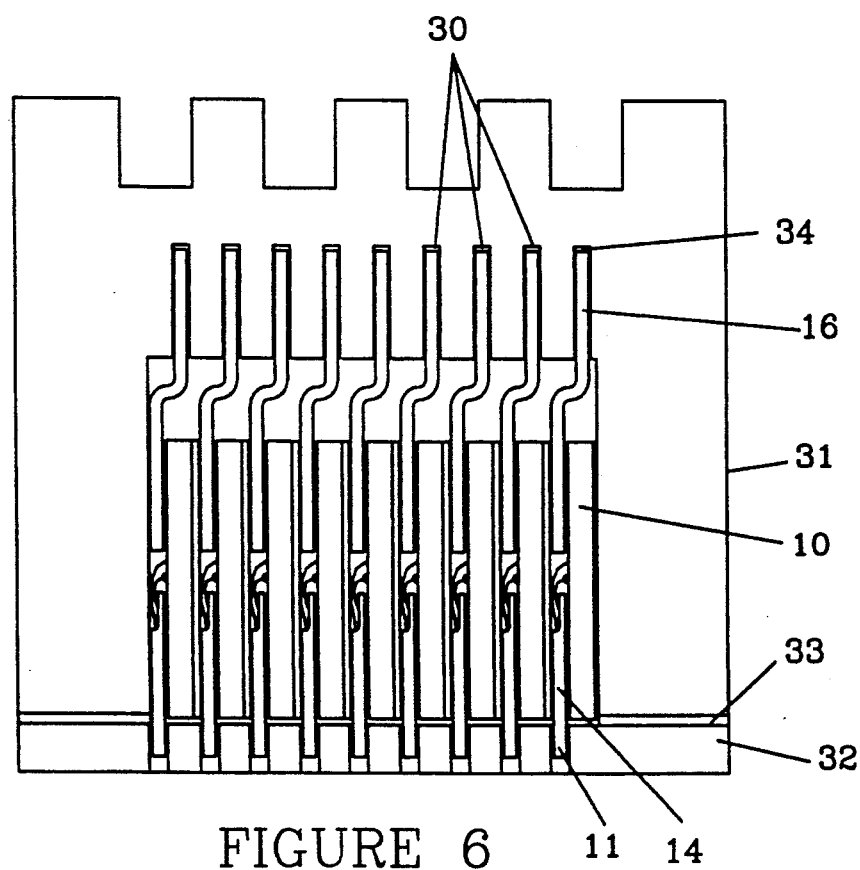
FIG. 6 illustrates a array of devices in a heat sink-/holding fixture.

FIG. 6 illustrates an array of devices mounted in a heat sink/holding fixture 31. To assembly an array 30 of devices 10, they may be mounted in heat sink/holding fixture 31 by placing the heat sink 16 of each device in a slot 34 in the top of the fixture. Also, the ends 11 of leads 14 may be inserted in a soldering mask 32, which, for example, may be of ceramic or other insulating material. Soldering mask 32 and fixture 31 may be bonded together by a high temperature adhesive 33. In the event the fixture 31 is not to remain over the device array, then fixture 31 may be removed after the leads 14 are soldered to a circuit board. However, the fixture 31 will generally be left over the array during testing and burn-in of the devices.

FIG. 7 illustrates an example of a solder mask such as solder mask 32 shown in FIG. 6. Solder mask 32 has, for example, an array of 8 rows, each row having twenty slots. The slots may, for example, be 13 mils by 3 mils. This size slot easily accommodates leads having dimensions of 10 mils by 1.4 mils, as used in TAB assemblies.

The thickness of this mask is generally about 0.20 inch or more.

FIG. 8 is a cross-sectional view showing an array of eight devices 10 with leads 14 inserted in the solder mask 32. The solder mask can also be used as a fixture to hold the devices 10 during assembly of the array and soldering of leads 14 to a circuit board. A heat sink 31a holds the heat sinks 16 of each device and holds the devices for mounting in mask 32 on substrate 15.

FIG. 9 is an enlargement of the portion of FIG. 8 that is circled. Illustrated is device 10 having a lead 14 inserted in an opening 40 in mask 32. The opening in mask 32 is enlarged at 41 adjacent to circuit board 15. Solder is applied from the back side of mask 32 and squeezed into hole 41 until a menicus is formed. The assembly is then aligned to the pattern on the substrate and placed. Solder is reflowed in the opening to bond the end of lead 14 to circuit board 15. In the event a throughhole bond is used, then lead 14 would extend through circuit board 15 (not illustrated) without the use of the solder mask.

FIG. 10 illustrates the heat sink 31a of FIG. 8. Heat sink 31a may be sprung open for securing the heat sink 15 of each device in slot 31b. The legs 31c and 31d are opened or moved apart to insert the heat sinks 16 into slots 31b. Each leg 31c and 31d moves, for example for "a" to "b" when the legs are pulled apart. Upon release of legs 31c and 31d, the heat sinks and devices attached thereto are held in place between 31c and 31d.

The process of making the array package, from semiconductor die manufacturing to mounting an array on a circuit board is as follows.

After the semiconductor die containing the semiconductor device has been formed, a coating barrier metal, such as TiW and Pd, are sputtered or otherwise deposited on the bond pads on the semiconductor device. The back side of the wafer containing the semiconductor devices is coated with an insulating material such as polyimide, and then the wafer is sawed to separate the individual devices. Leads, such as leads 14 FIG. 1, are mounted on the insulated surface of the device using a mounting material, such as an adhesive. Bond wires are attached to bond pad 13 and to lead 14. At this point in the process, the bond wire and connections are coated with polyimide to cover and protect the bond wire and connections. The lead frame is then trimmed and formed to produced the leads 14 and heat sink 16 (FIG. 2). Instead of wire bonding, Tape Automated Bonding (TAB) may be used, as illustrated in FIG. 3b.

The devices are then assembled into multiple device packages using a fixture such as illustrated in FIG. 6. Thereafter the array of devices are subjected to tests and burn-in to identify, if any, faulty devices. Any bad devices from an array can be removed from the fixture and replaced with a good device from another array. A good device array is then placed on a circuit board and bonded by solder reflow to electrically connect the array to the circuit board.

The package of the invention provides heating sinking of the array, a fixture for testing and burn-in in module form, easy repair and replacement of devices, high density of devices, and the ability to inter-mix various semiconductor devices in a low cost assembly.

What is claimed:

1. A vertical lead-on-chip package for a high density array of semiconductor devices, each device including an integrated semiconductor chip, comprising:
   at least two integrated semiconductor chips each having a plurality of leads mounted directly on and parallel to their respective integrated semiconductor chip and extending from one edge of the respective integrated semiconductor chip in a defined pattern;
   a printed circuit board having an array of contacts in a pattern which corresponds to the defined pattern of the plurality of leads on said at least two integrated circuit chips, the leads supporting the integrated semiconductor chips vertically above the printed circuit board;
   at least a heat sink mounted on and parallel to the integrated semiconductor chips and extending from another edge of each of said integrated semiconductor chips opposite the edge from which the plurality of leads extend: and
   a removable fixture having a plurality of slots therein, each slot for holding, within said slot, at least a heat sink mounted on said at least two integrated circuit devices for positioning said integrated circuit devices adjacent to each other in close proximity, and placing the plurality of leads of each device in a pattern corresponding to the array of contacts on the circuit board.

2. The package according to claim 1, including a removable fixture for holding said heat sinks during testing and burn-in of the semiconductor devices and prior to soldering the plurality of leads to said circuit board, and after soldering the array of devices onto the circuit board.

3. The package according to claim 1, where said plurality of leads are bonded to the circuit board using surface mounting.

4. The package according to claim 1, wherein said plurality of leads are bonded to the circuit board using through-hole mounting.

5. The package according to claim 1, wherein the integrated semiconductor chips are coated on both sides with polyimide.

6. The package according to claim 1, wherein a solder mask is used to hold the plurality of leads in a defined pattern during the application of solder paste onto the leads.

7. The package according to claim 1, wherein a solder mask is used in conjunction with the heat sink to hold the semiconductor devices during solder reflow.

8. The package according to claim 1, including a solder mask through which the plurality of leads extend.

9. The package according to claim 1, including a lead frame from which the leads and heat sink are formed.

10. A vertical lead-on-chip package for a high density array of semiconductor devices, each device including an integrated semiconductor chip, comprising:
   at least two integrated semiconductor chips each having a plurality of leads mounted directly on and parallel to their respective integrated semiconductor chip and extending from one edge of the respective integrated semiconductor chip in a defined pattern;
   a circuit board having an array of contacts in a pattern which corresponds to the defined pattern of the plurality of leads on said at least two integrated circuit chips, the leads supporting the integrated semiconductor chips vertically above the printed circuit board;

at least a heat sink mounted on and parallel to the integrated semiconductor chips and extending from another edge of each of said integrated semiconductor chips opposite the edge from which the plurality of leads extend; and removable heat sink fixture, having a plurality of slots therein, each slot for holding, via said at least a heat sink, each of said at least two integrated circuit devices adjacent to each other in close proximity, and placing the plurality of leads of each device in a pattern corresponding to the array of contacts on the circuit board.

11. The heat sink fixture for mounting an array of vertically lead-on chip semiconductor devices, according to claim 10, comprising;
- a heat sink fixture having a U-shaped body including a pair legs and a heat sink member;
- said pair of legs comprising a part of said U-shaped body that, when moved apart, return to original positions; and
- said heat sink member extending between said pair of legs;
- each of said plurality of slots, provided in said heat sink member, which, when the legs are moved apart, opens to receive a respective heat sink in each slot, and secures said respective heat sink in said slot when the legs are permitted to return to original positions.

* * * * *